United States Patent
Okutoh

[11] Patent Number: 5,853,908
[45] Date of Patent: Dec. 29, 1998

[54] PROTECTIVE DEVICE FOR SECONDARY BATTERIES

[75] Inventor: Tadashi Okutoh, Kawasaki, Japan

[73] Assignee: Nippon Moli Energy Corp., Kanagawa, Japan

[21] Appl. No.: 960,376

[22] Filed: Oct. 29, 1997

[30] Foreign Application Priority Data

Oct. 29, 1996 [JP] Japan ................................. 8-286757

[51] Int. Cl.$^6$ ............................................. H01M 14/00
[52] U.S. Cl. ............................ 429/7; 429/62; 429/90; 320/150
[58] Field of Search ................................ 429/61, 62, 90, 429/91, 7; 320/150, 152, 154

[56] References Cited

U.S. PATENT DOCUMENTS 5,569,550  10/1996  Garrett et al. ........................... 429/7
5,637,413   6/1997  Fernandez et al. ...................... 429/7
5,645,949   7/1997  Young ....................................... 429/7

*Primary Examiner*—Anthony Skapars
*Attorney, Agent, or Firm*—Gottlieb, Rackman & Reisman, P.C.

[57] ABSTRACT

The invention provides a protective device for batteries having a high energy density such as lithium ion batteries. The protective device includes a current conduction cutoff means having a current-conducting circuit comprising a voltage-detecting means for detecting the voltage of at least one battery being charged, a heat-generating resistance for starting the conduction of a current when the detected voltage exceeds a preset voltage, and a temperature fuse thermally coupled to the heat-generating resistance. When a state where battery voltage is higher than a preset value continues, a charging circuit for the battery is cut off by the temperature fuse and current output from the battery is disabled. The protective device further includes a battery-discharging means actuated upon detection of the fusing-down of the temperature fuse, so that the battery is disabled, and then placed in a dischargeable state.

4 Claims, 1 Drawing Sheet

PROTECTIVE DEVICE FOR SECONDARY BATTERIES

BACKGROUND OF THE INVENTION

The present invention relates to a device for protecting secondary batteries, and more particularly to a device for protecting secondary batteries having a high energy density such as lithium ion batteries using a material doping or dedoping lithium ions as an active anode material.

Lithium ion batteries employing carbonaceous materials capable of doping or dedoping lithium ions are lightweight battery systems having high operating voltage and a high energy density, and so expected to have applications in the form of power supply secondary batteries for various types of portable equipment including mobile radio communications terminals such as portable phones, portable personal computers, and camcorders.

A secondary battery can be repeatedly used by charging. For charging, however, full-charging should be achieved for a short time of period while care is taken of prevention of overcharging that may otherwise result in a malfunction or breakdown of the battery.

A lithium ion battery is built up of an anode formed of a carbonaceous material doping or dedoping lithium ions, a cathode formed of a lithium ion interlaminar compound such as at least one compound of $Li_xM_yO_z$ wherein M is Ni and/or Co and/or Mn, a separator formed of polyethylene, polypropylene or the like, and an electrolyte comprising a lithium salt dissolved in a non-aqueous organic solvent.

Upon overcharging of the lithium ion battery, the deposition of lithium on the anode occurs, and the internal pressure of the battery increases due to the generation of gases. When the internal pressure exceeds a certain threshold, an overpressure release valve is put into operation, resulting in electrolyte spills and, in the worst case, a breakdown of the battery.

According to one approach proposed to achieve a safe full-charging of a lithium ion battery while preventing any overcharging thereof, the lithium ion battery is charged using a constant current at an initial charging stage and then using a constant voltage at the time when the charging voltage reaches a predetermined voltage.

Even when charging is carried out under controlled charging current and voltage conditions, however, there is a possibility that the voltage applied on the battery may increase by reason of anything abnormal. This pressure increase may in turn put the battery in an overcharged state.

In only a few applications, single one lithium ion battery is used. In other words, it is general that, in order to obtain predetermined voltage or current, a plurality of batteries are set in a battery room in equipment with which they are used, or a battery package having a plurality of batteries therein is detachably mounted in equipment with which they are used. Even in this case, there is still an undeniable possibility that trouble with one battery in service may have some adverse or grave influences on the remaining batteries.

To provide protection against overcharging, and overcurrents at the time of charging or in service as well as to prevent malfunctions of batteries for the reason of discharging at a voltage below the final discharge voltage of the batteries, various protective devices have been proposed.

Once a lithium ion battery has been placed in an overcharged state, the battery itself may have some problems. A conventional device for providing protection against overcharging is designed to have a simple function of cutting off charging currents temporarily when charging voltage or charging currents exceed a certain threshold value, and so cannot protect lithium ion batteries against every expected trouble. It is thus demanded to have a device for protecting lithium ion batteries, etc. with ever-greater safety.

The present invention is concerned with a protective device for secondary batteries having high energy densities, for instance, lithium ion batteries using a carbonaceous material doping or dedoping lithium ions as an active anode material. A primary object of the present invention is to provide a protective device for secondary batteries which, when they are placed in an overcharged state, is actuated to disable them.

SUMMARY OF THE INVENTION

According to the present invention, such an object is achievable by the provision of a protective device for protecting secondary batteries employing a non-aqueous electrolyte, which is made up of a charging current-conducting circuit comprising a voltage-detecting means for detecting voltages of the batteries being charged, a heat-generating resistance for conducting a current when one of detected voltages exceeds a preset voltage, and a temperature fuse coupled thermally to the heat-generating resistance, so that when a state where the battery voltage detected is higher than the preset voltage continues longer than a preset time, the temperature fuse is fused down to cut off a charging circuit for the battery and cut off current output of the battery, thereby disabling the battery, and then placing the battery in a dischargeable state.

Preferably, the temperature fuse is located in the vicinity of the secondary batteries, and is fused down at a temperature lower than the highest temperature of a separator forming a part of the secondary batteries, at which said separator can be used.

Preferably, the protective device of the present invention further comprises a current conduction cutoff means designed to be actuated when a voltage detected by the voltage-detecting means goes down to a final discharge voltage, thereby preventing any overcharging of the battery.

Preferably, the protective device of the present invention further comprises a means for detecting a voltage drop upon conduction of a current through the current conduction cutoff means, so that when the detected voltage exceeds the preset voltage, the current is cut off by the cutoff means to provide protection against an overcurrent.

DESCRIPTION OF THE PREFERRED EMBODIMENT

Figure 1:
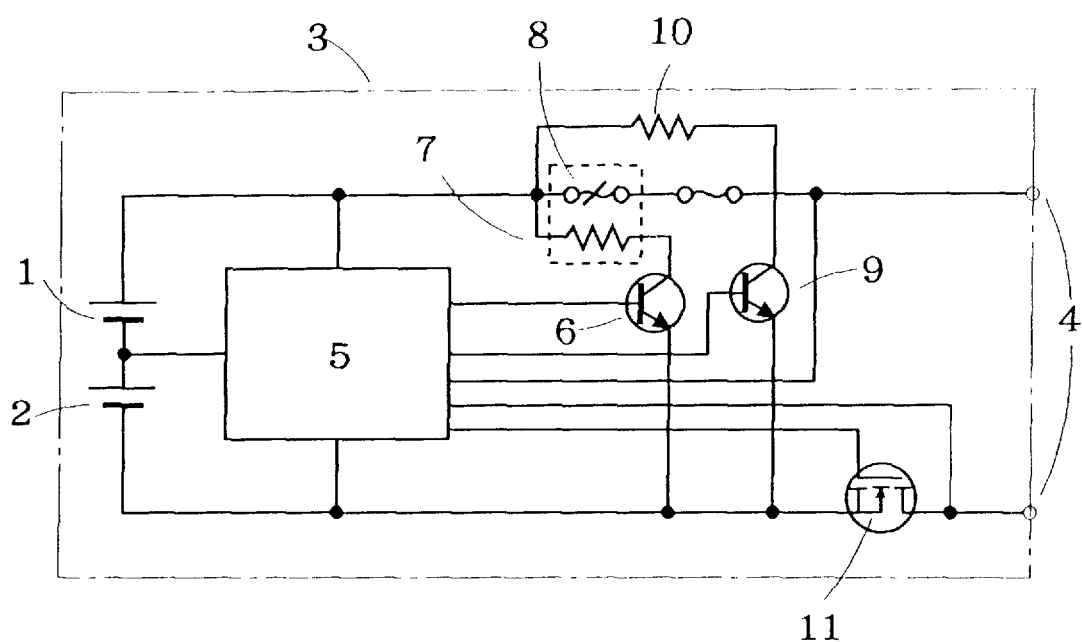
FIG. 1 is a schematic illustrative of one embodiment of the protective device according to the present invention.

The present invention provides a protective device for secondary batteries having a high energy density such as lithium ion batteries using a carbonaceous material doping or dedoping lithium ions for an anode, which comprises a temperature fuse that is fused down by heat generated from a heat-generating resistance in an overcharged state at a temperature lower than the temperature at which the batteries can be used, and a discharging means actuated upon the fusing-down of the temperature fuse. After the overcharged state continues longer than the preset time, the charging process is finished to disable the battery and then place it in a dischargeable state. In the present invention, the detection of the overcharged state is not performed only by use of current or voltage. In the other words, it is only after a current has passed through the heat-generating means for the preset time that the temperature fuse is fused down to actuate a cutoff device. In addition, the protective device of the present invention further comprises a current conduction cutoff means for cutting off a current when the battery voltage goes down to the final discharge voltage, and a means for detecting a voltage drop upon conduction of a current through the cutoff means to cut off the conduction of the current when the voltage drop detected exceeds the preset drop. It is thus possible to protect the secondary batteries against overcharging and an overcurrent.

A preferred embodiment of the protective device according to the present invention will now be explained with reference to FIG. 1 referred to above.

FIG. 1 illustrates a protective device contained in a battery package 3 having two lithium ion batteries 1 and 2. Input/output terminals 4 in the protective device are connected at the time of charging to a constant-current and -voltage charging power source comprising a constant current-generating circuit, a constant voltage-generating circuit, a smoothing circuit and the like, and at the time of discharging to equipment with which the batteries are used.

A controller 5 includes a voltage drop-detecting means comprising a voltage-detecting means, a means for detecting the fusing-down of a temperature fuse, and a current conduction cutoff means.

The voltage-detecting means monitors the voltages of the lithium ion batteries 1 and 2. When either one of the voltages exceeds a preset voltage, the voltage-detecting means is actuated to detect an overcharged state, if any, so that a current is conducted through a heat-generating resistance 7 while a transistor 6 forming a heat-generating means remains conducted. The heat-generating resistance 7 is thermally coupled to a temperature fuse 8 provided in a charging current conduction circuit. Preferably, the heat-generating resistance has a heat capacity large enough to fuse down the temperature fuse for a given time, especially 10 to 30 seconds.

Since, in the present invention, the temperature fuse is used as the current cutoff means at the time of overcharging, it is possible to avoid malfunctions, e.g., current cutoffs caused as by momentarily abnormal voltages. In addition, ever-greater safety is achievable because even though a battery has anything abnormal due to overcharging, it can then be disabled to such an extent that it cannot conduct a current even by removal of an overcurrent state.

Preferably, the temperature fuse is located in the vicinity of batteries, and can be fused down at a temperature lower than the highest temperature of a separator forming a part of the batteries, at which the separator can be used. For a lithium ion battery, a microporous polyethylene or polypropylene separator is used. At high temperatures, however, the separator is not only softened to such a degree that it can no longer function as a separator, but also induces the reaction between active cathode and anode materials, often resulting in an internal pressure increase, thermal runaway, and so on. The upper limit of temperatures at which currently available polyethylene separators can be used is about 110° C. In the practice of the present invention, therefore, it is preferable to use a temperature fuse that can be fused down at a temperature of up to 110° C.

When the temperature fuse is fused down by overcharging during the charging process of a battery, the active materials are in a dischargeable state even after the supply of the charging current has been cut off. The amount of the active materials in the dischargeable state varies depending on to what degree the battery is charged. However, if a battery that may have anything unusual due to overcharging, especially a lithium ion battery having a high energy density, is in a dischargeable state, a large amount of energy is then built up in the form of active materials. This may in turn lead to an intermediate likelihood of thermal runaway, an internal pressure increase, etc.

Such a problem, too, can be solved by the present invention because, when the temperature fuse is fused down by the actuation of an overcharged state-detecting means or when the temperature fuse is fused down by heat generated in the battery or an ambient temperature rise, the fusing-down of the battery is detected by means for detecting the fusing-down of the temperature fuse in a controller so that the energy built up in the battery can be released by a discharging means made up of a switching transistor 9 and a discharging resistance 10, thereby placing the battery in a safe state.

Preferably, the protective device for secondary batteries according to the present invention is provided with a safeguard means against overcharging, which is actuated to interrupt discharge when the battery voltage-detecting means in the controller 5 detects that the voltage of either one of the batteries is lower than the final discharge voltage. This safeguard means against overcharging may be made up of a switching element 11 comprising a field-effect type transistor operable to cut off the supply of a current when the detected voltage is lower than the preset value.

Preferably, the protective device for second batteries according to the present invention is provided with a safeguard means against an overcurrent, which is actuated to cut off a current when an overcurrent flows longer than a preset time during the discharging process of the batteries. For this safeguard means, a switching element designed to go back to a current-conducting state upon removal of an overcurrent-providing load may be used in combination with a fuse that is fused down upon the conduction of a large current.

Especially if the safeguard means against an overcurrent is designed in such a manner that a voltage drop of the current cutoff switching element is detected by an overcurrent-detecting means in the controller to cut off the current cutoff switching element, it can also be used as the switching element 11 that provides protection against overcharging. It is thus possible to dispense with two switching elements for providing protection against overcharging and an overcurrent, which must otherwise be located in a battery current-conducting circuit. This in turn makes it possible to reduce a voltage drop by the switching elements, which becomes noticeable when the current delivered from batteries to equipment with which they are used becomes large. Thus, it is possible to achieve delivery of large currents.

When the safeguard means against an overcurrent detects that a voltage drop proportional to the current conducted exceeds a predetermined value, it puts the switching element in operation to cut off the conduction of the current, thereby providing protection to the batteries. However, this safeguard means goes back to the current-conducting state by removal of an overcurrent-providing load. When the fuse designed to be fused down upon the passage of a larger overcurrent is provided, it is then possible to disable the batteries upon the passage of a larger overcurrent.

In the present invention, the temperature fuse, which is fused down by the generation of heat in the heat-generating resistance in an overcharged state or an increase in battery temperature or ambient temperature at a temperature lower than the temperature at which the batteries are usable is combined with the discharging means which is actuated upon the fusing-down of the temperature fuse. This enables the charging process to be finished after the overcharged state continues for a predetermined time, and makes it possible to place the batteries in a disabled state, and then in a dischargeable state. According to the present invention, the means for cutting off the conduction of a current when the battery voltage is lower than the final discharge voltage is used as the means for cutting off the conduction of the current by an overcurrent. It is thus possible to reduce the voltage drop during the conduction of the current, thereby achieving a protective device usable with a large current.

What we claim is:

1. A protective device for secondary batteries using a non-aqueous electrolyte, which includes a current-conducting circuit comprising a voltage-detecting means for detecting voltages of a plurality of batteries during charging, a heat-generating resistance which conducts a current when one of detected voltages is higher than a preset voltage, and a temperature fuse thermally coupled to said heat-generating resistance, so that when a state where the detected battery voltage is higher than a preset value continues longer than a preset time, said temperature fuse is fused down to cut off a charging circuit for said batteries and an output circuit from said batteries, and further includes a battery-discharging means actuated upon detection of the fusing-down of said temperature fuse to place said battery in a dischargeable state.

2. The protective device of claim 1, wherein said temperature fuse is located in the vicinity of said secondary batteries, and is fused down at a temperature lower than the highest temperature at which a separator forming a part of each secondary battery is usable.

3. The protective device of claim 1 or 2, which further includes a cutoff means actuated when the voltage detected by said voltage-detecting means drops to a final discharge voltage, thereby cutting off conduction of a current to protect said batteries against overcharging.

4. The protective device of claim 3, which further includes a means for detecting a voltage drop during conduction of a current in said cutoff means, so that when a detected voltage exceeds said preset voltage, the conduction of the current is cut off by said cutoff means to protect said batteries against an overcurrent.

* * * * *